United States Patent [19]
Nakasuji et al.

[11] Patent Number: 6,083,648
[45] Date of Patent: Jul. 4, 2000

[54] MICROLITHOGRAPHY RETICLE EXHIBITING REDUCED STRESSES AND METHODS FOR MANUFACTURING SAME

[75] Inventors: Mamoru Nakasuji, Yokohama; Shin-Ichi Takahashi, Tokyo, both of Japan

[73] Assignee: Nikon Corporation, Tokyo, Japan

[21] Appl. No.: 09/240,209

[22] Filed: Jan. 29, 1999

[30] Foreign Application Priority Data

Feb. 4, 1998 [JP] Japan .................................. 10-036606

[51] Int. Cl.⁷ ...................................... G03F 9/00
[52] U.S. Cl. ................................. 430/5; 430/296
[58] Field of Search .............................. 430/5, 296, 322, 430/323; 438/704, 710; 378/34, 35

[56] References Cited

U.S. PATENT DOCUMENTS 5,798,194  8/1998  Nakasuji et al. ............................. 430/5

5,972,794  10/1999  Katakura .................................. 438/704

FOREIGN PATENT DOCUMENTS 5-291121  11/1993  Japan .

Primary Examiner—S. Rosasco
Attorney, Agent, or Firm—Klarquist Sparkman Campbell Leigh & Whinston, LLP

[57] ABSTRACT

Reticles are disclosed for charged-particle-beam microlithography. Such reticles comprise a reticle membrane. A first set of parallel struts extends at a first pitch in a first direction and a second set of parallel struts extends at a second pitch (higher than the first pitch) in a second direction perpendicular to the first direction and intersecting the first set of struts. The struts are attached to the first major surface of the membrane and partition the membrane into multiple rectangular fields each comprising a respective portion of the membrane extending between respective intersecting struts. The second struts are flanked by boundary regions each having a width larger than ⅕ of the width of the respective field.

14 Claims, 1 Drawing Sheet

MICROLITHOGRAPHY RETICLE EXHIBITING REDUCED STRESSES AND METHODS FOR MANUFACTURING SAME

FIELD OF THE INVENTION

This invention pertains to reticles (masks) as used in microlithographic transfer-exposure, using a charged particle beam such as an electron beam or ion beam, of a pattern defined by the reticle onto a sensitive substrate. More specifically, the invention pertains to reticles defining high-precision patterns exhibiting resistance to stress-related damage. As used herein, the "reticle" typically defines a pattern to be projection-transferred to a sensitive substrate as performed during the manufacture of integrated circuits, displays, and the like.

BACKGROUND OF THE INVENTION

In charged-particle-beam (CPB) projection-exposure microlithography, a charged particle beam (e.g., an electron beam) is used to transfer a pattern, defined by a reticle, onto the surface of the sensitive substrate such as a semiconductor wafer.

Conventional electron-beam projection-exposure exhibits high resolution but is flawed by low throughput (i.e., number of wafers that can be projection-exposed per unit time). Various approaches have been investigated to improve throughput.

One current approach, commonly termed "hybrid" pattern-area exposure (also termed "cell" projection, "character" projection, or "block" exposure), utilizes a reticle that defines multiple repetitive portions of the overall pattern to be projection-exposed onto the substrate. Each portion when projected onto the wafer typically measures approximately 5 $\mu$m×5 $\mu$m. Transfer of the mask pattern occurs by repeatedly exposing a single small pattern on the reticle onto multiple locations on the wafer, using an electron beam.

Unfortunately, hybrid pattern-area exposure requires much time to accomplish, especially with respect to non-repetitive portions of the pattern. Consequently, compared to other methods, throughput with hybrid pattern-area exposure can be lower by about one order of magnitude when applied to the actual production of basic semiconductor integrated circuit devices (e.g., DRAMs, etc.). In addition, the microprocessors that have been the subject of the most recent intensive R&D and production efforts have little to no pattern repetition; hence, hybrid pattern-area exposure is of little utility for such applications.

Another conventional electron-beam approach is "reduction" (demagnifying) projection-transfer as disclosed, e.g., in Japanese Kôkai patent document no. HEI 5-160012. This technique offers prospects of substantially higher throughput than hybrid pattern-area exposure, and can be employed in the manufacture of microprocessors and the like. Successive portions of the pattern, defined by the reticle, of an entire die or "chip" are sequentially irradiated with the electron beam. The resulting image of the irradiated portion of the reticle is reduced and transferred to the wafer by a two-stage projection lens through which the electron beam passes.

In reduction projection-transfer, an entire die cannot practicably be irradiated by the electron beam all at once (so as to transfer the entire die pattern at once). Hence, the die pattern is usually divided into multiple fields and subfields. The die is transferred by sequentially transferring the pattern portion defined by each subfield, during which any of various parameters of the electron-beam optical system can be changed as required for the particular subfield. The projected images of the subfields (each measuring, e.g., 250 $\mu$m×250 $\mu$m) are arrayed and "stitched together" on the wafer surface.

An example of a reticle as used for reduction projection-transfer is disclosed in U.S. Pat. No. 5,260,151. The reticle is referred to therein as a "grillage". The reticle is divided into multiple subfields each measuring approximately 1 mm×1 mm square. The subfields are arrayed in a checkerboard grid pattern on a thin Si membrane (500 to 2000 nm thick). The subfields are separated from one another by non-patterned boundary regions (each approximately 0.1 mm wide) called "skirts". The reticle also comprises orthogonally intersecting reinforcing struts (each approximately 0.1 mm thick) arranged so as to surround each subfield at the skirts. The pattern portion in each subfield is defined by a respective membrane configured such that an electron beam incident perpendicularly (orthogonally) to the membrane at an acceleration voltage of approximately 100 kV is scattered to some extent while most of the electrons in the beam are transmitted through the membrane. The struts reinforce the membranes and enable a reticle measuring, e.g., 200 mm×100 mm overall to be self-supporting.

During manufacture of a grillage reticle, a layer destined to become the membrane is formed on the surface of a relatively thick reticle substrate. Etching is used to remove, down to the membrane layer, most of the reticle substrate while leaving portions of the reticle substrate that form the struts. During such etching, large stresses are frequently concentrated in the membrane layer near regions where the struts intersect each other (i.e., at the corners of the subfields). Formation of certain pattern features (e.g., holes, etc.) at such corners can cause excessive release of stress which causes deformation or displacement of the features, and consequent deterioration of pattern accuracy or actual damage to the membrane.

SUMMARY OF THE INVENTION

In view of the foregoing, an object of the invention is to provide microlithographic reticles, for use with a charged particle beam (e.g., electron beam, ion beam, or the like), that define pattern features with very high accuracy, and are more resistant to stresses and stress-caused damage than conventional reticles.

According to a first aspect of the invention, reticles are provided for charged-particle-beam microlithography of a pattern, defined by the reticle, onto a sensitive substrate. A representative embodiment of such a reticle comprises a reticle membrane having first and second opposing major surfaces. The reticle also comprises a first set of parallel struts extending at a first pitch (i.e., distance between adjacent struts) in a first direction and a second set of parallel struts extending at a second pitch in a second direction perpendicular to the first direction and intersecting the first set of struts. The first pitch is lower than the second pitch (i.e., the struts in the first set are closer together than the struts in the second set). The struts are attached to the first major surface of the membrane and effectively partition the membrane into multiple rectangular fields each comprising a respective portion of the membrane extending between respective intersecting struts. Each field defines features of a respective portion of the pattern. The second struts are flanked by boundary regions on the membrane, wherein the boundary regions each have a width larger than ⅕ of the width of the respective field.

The membrane is preferably p-type monocrystalline silicon, and the struts are preferably n-type monocrystalline silicon. The second major surface of the reticle is preferably a [110] crystal plane of the monocrystalline silicon.

Reticles according to the foregoing representative embodiment can be "stencil" type or "scattering" type as these terms are understood in the relevant art. With respect to a stencil reticle, the respective pattern portion defined by each field comprises a respective pattern of through-holes in the respective portion of the membrane. With respect to a scattering reticle, the respective pattern portion defined by each field comprises a respective pattern of regions of a CPB-scattering material on the respective portion of the membrane. The pattern of regions of the CPB-scattering material can be defined in a layer of such scattering material disposed on the respective portion of the membrane.

Each field typically comprises multiple subfields each defining a respective portion of the pattern portion defined by the respective field. The subfields can be separated from one another in each field by intervening boundary regions. Alternatively, the subfields can be contiguous on the reticle with no intervening boundary regions between the subfields in a field. Also, the first struts can be flanked by boundary regions in each field.

According to another aspect of the invention, methods are provided for manufacturing a segmented mask for CPB microlithography. A representative embodiment of such a method comprises the following steps. In a first step, an n-type silicon reticle substrate is provided having a thickness suitable for a height dimension of reticle struts. On a first major surface of the reticle substrate, a p-type layer is formed (e.g., by surficial doping of the first major surface of the n-type monocrystalline silicon) having a thickness suitable for a thickness dimension of a reticle membrane. In a second step, a resist pattern is applied to the second major surface. The resist pattern corresponds to a desired pattern of struts. The pattern comprises an arrangement of a first set of parallel struts extending at a first pitch in a first direction and a second set of parallel struts extending at a second pitch (greater than the first pitch) in a second direction perpendicular to the first direction and intersecting the first set of struts. Thus, multiple rectangular fields are defined between the struts, each field having a width dimension. In a third step, regions of the reticle substrate not protected by the resist pattern are etched away from the second major surface. The etching is allowed to progress through the reticle substrate to the p-type layer, thereby forming the intersecting struts attached to the p-type layer which serves as a reticle membrane. In a fourth step, respective portions of the reticle pattern are defined in respective fields on the reticle membrane while leaving boundary regions flanking the second struts in each such field. The boundary regions each have a width larger than ⅕ of the width of the respective fields.

Preferably, the first and second major surfaces are in the [110] crystal plane of the n-type monocrystalline silicon, and the first set of struts are preferably configured to extend in the [111] crystal plane of the n-type monocrystalline silicon.

Hence, in reticles according to the invention, the corners of the membrane in each field (in which corners distortions and other manifestations of internal stress concentrate) do not define any pattern features. This prevents deterioration of the accuracy with which pattern transfer can be performed using the reticle. With respect to stencil reticles according to the invention, since the reticle is formed so as not to have through-holes in the corners of the fields, damage to the reticle caused by cracks in the perimeters of such holes arising from concentration of stress can be prevented.

The foregoing and additional features and advantages of the invention will be more readily apparent from the following detailed description, which proceeds with reference to the accompanying drawings.

BRIEF DESCRIPTION OF THE DRAWINGS

FIG. 1(A) is a plan view of the downstream-facing surface of one area of the reticle. FIG. 1(B) is a vertical section, along the line B-B', of the area shown in FIG. 1(A). FIG. 1(C) is a vertical section, along the line C-C', of the area shown in FIG. 1(A).

DETAILED DESCRIPTION

Figure 1A:
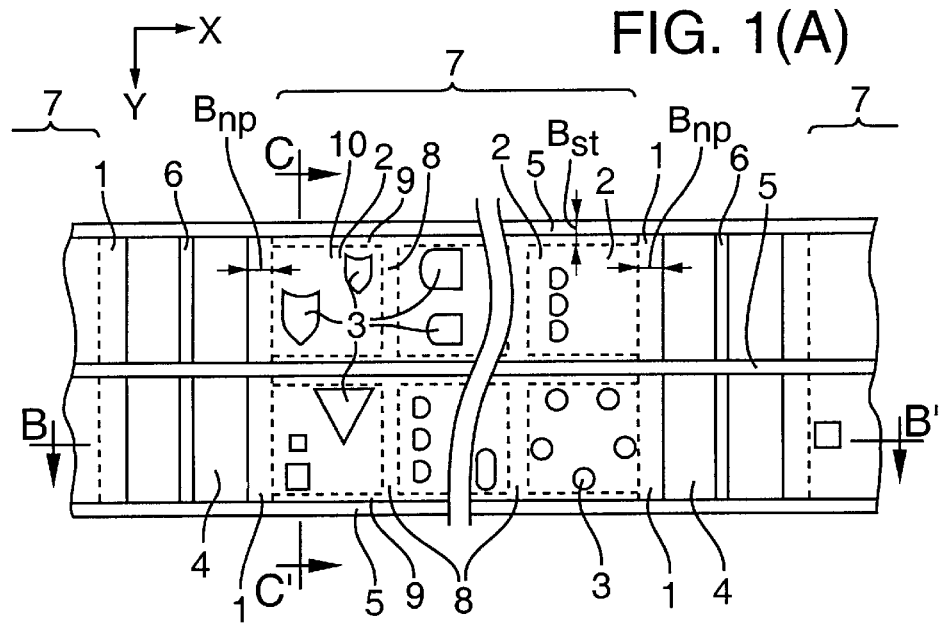
FIGS. 1(A)–1(C) show a representative structure of a stencil-type reticle for electron-beam projection-exposure, according to a first example embodiment of the invention.
Figure 1B:
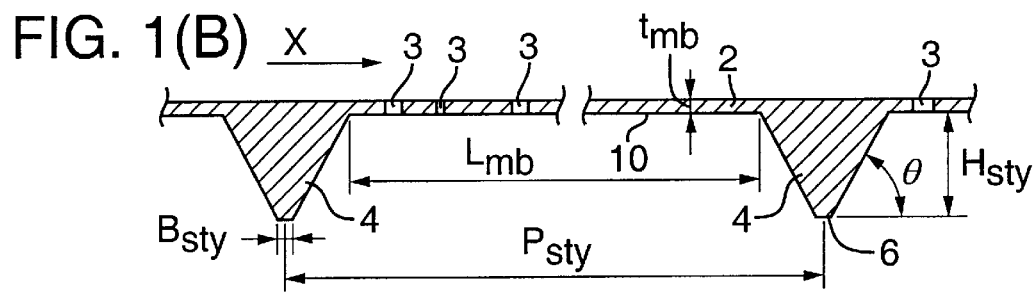
Figure 1C:
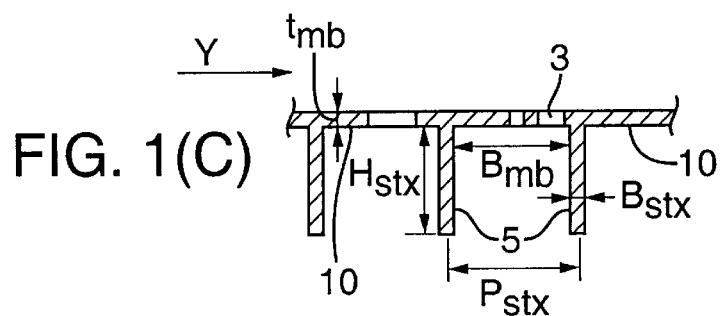

FIGS. 1(A)–1(C) depict a stencil-type reticle according to a first representative embodiment. Although the reticle of this embodiment is especially suitable for electron-beam projection-exposure, it will be understood that the general principles of this embodiment, as discussed below, are also applicable for use with any of various other charged particle beams.

The reticle in this example embodiment is preferably fabricated by etching a monocrystalline Si reticle substrate.

The reticle shown in FIGS. 1(A)–1(C) comprises a membrane 10 (FIG. 1(B)) from which struts 4, 5 project in the downstream direction (FIGS. 1(B) and 1(C), respectively). It will be understood that FIG. 1(A) shows only a portion of the reticle which extends further in the X and Y directions than shown in FIG. 1(A). The struts 5 extend parallel to each other in the X direction, and the struts 4 extend parallel to each other in the Y direction (FIG. 1(A)). Thus, the struts 4 are oriented orthogonally to the struts 5. In this example, the struts 5 have a width $B_{stx}$ of 0.1 mm, a height $H_{stx}$ of 1 mm, and a pitch $P_{stx}$ in the Y direction in the figure of 1.3 mm. The struts 5 preferably have side walls perpendicular to the surface of the membrane 10 (FIG. 1(C)).

The struts 4 in this embodiment have a sectional profile similar to that of a truncated isosceles triangle in which the sides are angled θ55° as shown in FIG. 1(B). The truncated apex of the profile has a width $B_{sty}$=0.1 mm in this example. (The angled sides of the struts 4 are an artifact of an etching step, described below, of n-type monocrystalline silicon used to form the reticle. Under different manufacturing conditions the struts 4 can be formed so as to have side walls perpendicular to the surface of the membrane 10.) Also with respect to this example, the height $H_{sty}$ of each strut 4 is 1 mm, and the pitch $P_{sty}$ of the struts 4 in the X direction is approximately 42 mm.

In this example, the membrane extending between two adjacent X-direction struts 5 has a width $B_{mb}$=1.2 mm, and the membrane extending between two adjacent Y-direction struts 4 has a length $L_{mb}$ of approximately 40 mm. This membrane region is effectively a "field" on the reticle, wherein multiple fields are typically necessary to define the entire pattern defined by the reticle. The thickness $t_{mb}$ of the membrane 10 in each field is 2 μm (i.e., 20,000Å) in this example. Thus, in each field, the membrane 10 is effectively the "ceiling" of a long, narrow "groove" etched in the downstream surface of the reticle.

Further with respect to this example, non-patterned boundary regions 1, each having a width $B_{np}$=240 μm in this example, are situated in each field adjacent the Y-direction struts 4. Pattern features, such as stencil holes or localized deposits of a scattering layer (described below with respect to FIG. 2), are not formed in the boundary regions 1.

The width of the boundary regions 1 in this example is determined as follows: A rectangular groove having a width of 1.2 mm and a length of 80 mm was formed in a 1-mm thick Si wafer (serving as a reticle substrate) to form a field. The groove had a depth dimension such that a 2$\mu$-mm thick Si membrane was left to define the field. Residual stresses at various locations in the Si membrane (compared to stress levels at the same locations in the reticle substrate before etching) were determined by evaluating shifts in anti-Stokes lines exhibited by the reticle caused by etching. Such analysis revealed that, after etching, much of the etch-caused stress was concentrated in the membrane in the four corners of the groove. Etching caused virtually no change in stress (the stress being low before etching) in the membrane at a distance of 200 $\mu$m or more from the corners and edges (including the center of the groove). Thus, it was determined that no stress-related distortion or other problems would arise in the pattern defined by the reticle so long as no pattern features were defined in the membrane within a boundary region extending (1.2 mm) (⅕)=240 $\mu$m from the strut 4 (wherein 1.2 mm is the width of the groove). This principle appeared to be applicable whether the reticle was a stencil reticle or a scattering reticle.

Referring further to FIG. 1(A), non-patterned boundary regions 9 (0.1 mm wide in this example) are preferably provided in each field flanking the struts 5 extending in the X direction. Also, the area of the membrane situated outside the boundary regions 1 and 9 is divided into multiple subfields 2 separated from one another by a respective boundary region 8. In this example, each subfield 2 measures 1 mm×1 mm. Pattern features (e.g., the stencil features 3) of various shapes as required are defined in the subfields 2 according to the respective pattern portion defined by each subfield 2.

Projection-exposure of the subfields 2 can be performed subfield-by-subfield in each field or by raster scanning each field. In subfield-by-subfield exposure, the subfields 2 in each field are illuminated one-by-one by the charged particle beam (e.g., an electron beam) having a transverse profile (i.e., a profile extending in the X and Y directions perpendicular to the propagation axis of the beam) measuring slightly greater than 1 mm×1 mm in this example. Sequential illumination of the subfields 2 is performed by lateral deflection of the beam. Passage of the beam through each illuminated subfield 2 causes the beam to be patterned by the subfield. The patterned beam is demagnified and projected by a projection-optical system (comprising lenses and deflectors as required) to form an image of the irradiated subfield on a wafer substrate. (The wafer substrate is typically "sensitized" by a coating of a suitable resist in which the images of the irradiated subfields can be imprinted.) On the wafer substrate, the demagnified images of the various subfields are joined ("stitched") together to form the complete circuit pattern extending in the X and Y directions on the wafer substrate.

For projection-exposure by raster scanning, the subfields 2 of each field need not be separated from one another by respective boundary regions 8. Hence, each field is exposed by scanning the charged particle beam in the X direction (in FIG. 1(A)) lengthwise across the field.

A representative method for preparing a reticle as described above is as follows. An n-type monocrystalline Si substrate (e.g., 1-mm thick) is provided having first and second opposing major surfaces in the [110] crystal plane. The first major surface is doped to a depth of, e.g., 2 $\mu$m with boron to form a p-type surficial layer on the Si substrate. Selecting the X direction in FIG. 1(A) as the [111] crystal orientation, the struts 5 are configured so as to extend parallel to the [111] crystal orientation. To such end, parallel strips (each having an exemplary width $B_{st}$=100 $\mu$m) of a silicon nitride protective film are formed at an exemplary pitch $P_{stx}$=1.3 mm across the second major surface. In order to complete the outlines of the fields 7, parallel strips (each having an exemplary width of 100 $\mu$m which is substantially equal to the width of the apices 6 of the struts 4) of the silicon nitride protective film are also formed extending in the Y direction on the second major surface at a pitch $p_{sty}$. The regions between the strips are destined, after etching, to form the fields 7 of the reticle.

The etching is preferably anisotropic, performed using KOH, for example, and is allowed to proceed through the thickness of the n-type Si substrate to the p-type layer. The [111] plane (which is not easily etched by KOH) of the monocrystalline Si substrate is exposed on the side surfaces of the X-direction struts 5 and of the side surfaces of the Y-direction struts 4.

Each field thus formed includes the respective membrane 10, formed from the residual p-type layer, extending between the struts 4, 5 formed from residual n-type Si. Pattern formation within the fields on the membrane 10 is preferably performed lithographically which results in the formation of the features 3 in the various subfields 2.

As described above, boundary regions 1 are provided at each end of each field 7. Also, boundary regions 8 can be provided between the subfields 2. In this example embodiment, the boundary regions 1 are each 250 $\mu$m wide, determined as described above. According to the invention, stress concentrations are limited to these boundary regions 1. Since the boundary regions 1 contain no features 3, no positional shifting of the features 3 occurs with such a reticle, even when measurements are performed with nanometer accuracy.

Figure 2:
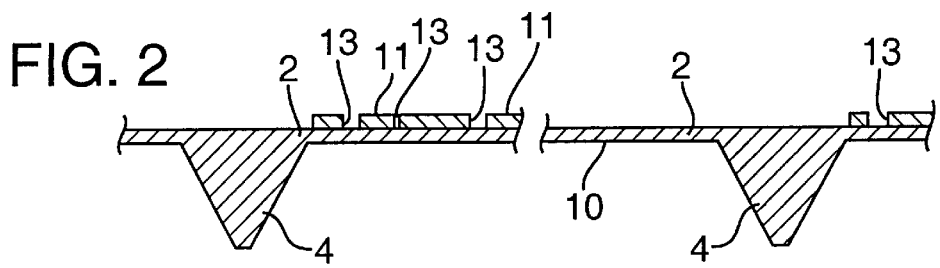
FIG. 2 is a vertical section of a scattering-type reticle according to a second example embodiment of the invention.

FIG. 2 depicts a representative section of a scattering reticle according to a second example embodiment. In this example, a scattering film 11 (made from, e.g., Cr or Ti) is formed on the upstream-facing major surface of the membrane 10. The scattering film 11 can be formed by, e.g., sputtering or vacuum deposition and has a thickness normally of 100–200 nm. The features 13 are formed by etching the scattering film 11 (by reactive-ion etching or the like). To avoid stress-related positional shifts of the features on the reticle, no features were formed in a boundary region (e.g., 250 $\mu$m wide) flanking each Y-direction strut 4.

As is clear from the foregoing, this invention provides highly accurate reticles for use with CPB microlithography that include struts for stiffness but that are resistant to damage or distortion caused by stresses concentrated around the struts.

Whereas the invention has been described in connection with representative embodiments and examples, it will be understood that the invention is not limited to those embodiments and examples. On the contrary, the invention is intended to encompass all alternatives, modifications, and equivalents as may be included within the spirit and scope of the invention as defined by the appended claims.

What is claimed is:

1. A reticle for charged-particle-beam microlithography of a pattern, defined by the reticle, onto a sensitive substrate, the reticle comprising:

(a) a reticle membrane having first and second opposing major surfaces;

(b) a first set of parallel struts extending at a first pitch in a first direction and a second set of parallel struts extending at a second pitch in a second direction perpendicular to the first direction and intersecting the first set of struts, the first pitch being lower than the second pitch and the struts being attached to the first major surface of the membrane and partitioning the membrane into multiple rectangular fields each comprising a respective portion of the membrane extending between respective intersecting struts, each field having a width and defining features of a respective portion of the pattern; and (c) the second struts being flanked by boundary regions on the membrane, the boundary regions each having a width larger than ⅕ of the width of the respective field.

2. The reticle of claim 1, wherein the membrane is p-type monocrystalline silicon.

3. The reticle of claim 1, wherein the struts are n-type monocrystalline silicon and the second major surface is a [110] crystal plane of the monocrystalline silicon.

4. The reticle of claim 1, wherein the respective pattern portion defined by each field comprises a respective pattern of through-holes in the respective portion of the membrane.

5. The reticle of claim 1, wherein the respective pattern portion defined by each field comprises a respective pattern of regions of a charged-particle-beam scattering material on the respective portion of the membrane.

6. The reticle of claim 5, wherein the pattern of regions of the charged-particle-beam scattering material is defined in a layer of such scattering material disposed on the respective portion of the membrane.

7. The reticle of claim 1, wherein the first struts are flanked by boundary regions.

8. A reticle for charged-particle-beam microlithography of a pattern, defined by the reticle, onto a sensitive substrate, the reticle comprising:

(a) a reticle membrane having first and second opposing major surfaces;

(b) a first set of parallel struts extending at a first pitch in a first direction and a second set of parallel struts extending at a second pitch in a second direction perpendicular to the first direction and intersecting the first set of struts, the first pitch being lower than the second pitch and the struts being attached to the first major surface of the membrane and partitioning the membrane into multiple rectangular fields each comprising a respective portion of the membrane extending between respective intersecting struts, each field having a width and defining features of a respective portion of the pattern; and (c) each field comprising multiple subfields each defining a respective portion of the pattern portion defined by the respective field.

9. The reticle of claim 7, wherein the subfields are separated from one another in each field by intervening boundary regions.

10. A method for manufacturing a segmented mask for charged-particle-beam microlithography, the method comprising the steps:

(a) providing an n-type silicon reticle substrate having a thickness suitable for a height dimension of reticle struts, the reticle substrate having first and second opposing major surfaces;

(b) on the first major surface, forming a p-type layer having a thickness suitable for a thickness dimension of a reticle membrane;

(c) on the second major surface, applying a resist pattern corresponding to a desired pattern of struts, the pattern comprising an arrangement of a first set of parallel struts extending at a first pitch in a first direction and a second set of parallel struts extending at a second pitch in a second direction perpendicular to the first direction and intersecting the first set of struts, the first pitch being lower than the second pitch so as to define multiple rectangular fields between the struts, each field having a width dimension;

(d) from the second major surface, etching away regions of the reticle substrate not protected by the resist pattern, the etching being allowed to progress through the reticle substrate to the p-type layer, thereby forming the intersecting struts attached to the p-type layer which serves as a reticle membrane; and (e) in respective fields on the reticle membrane, defining a respective portion of a reticle pattern while leaving boundary regions flanking the second struts in each such field.

11. The method of claim 10, wherein the first and second major surfaces are in the [110] crystal plane of the n-type monocrystalline silicon.

12. The method of claim 11, wherein the first set of struts was configured to extend in the [111] crystal plane of the n-type monocrystalline silicon.

13. The method of claim 10, wherein the boundary regions each have a width larger than ⅕ of the width of the respective fields.

14. A segmented reticle produced according to the method of claim 10.

* * * * *

UNITED STATES PATENT AND TRADEMARK OFFICE
CERTIFICATE OF CORRECTION

PATENT NO.    : 6,083,648

DATED         : July 4, 2000

INVENTOR(S)   : Mamoru Nakasuji and Shin-Ichi Takahashi

It is certified that errors appear in the above-identified patent and that said Letters Patent is hereby corrected as shown below:

In Column 4, line 45, "θ55°" should read -- $\theta = 55°$ --.

In Column 5, line 9, "2μ-mm" should read --2-μm--.

In Column 6, line 14, "$p_{sty.}$" should read --$P_{sty.}$--.

In Column 6, line 51, "250 μm" should read --250-μm--.

Signed and Sealed this

Twenty-second Day of May, 2001

*Attest:*

NICHOLAS P. GODICI

*Attesting Officer*   *Acting Director of the United States Patent and Trademark Office*